(12) United States Patent
Anderson et al.

(10) Patent No.: US 6,474,476 B1
(45) Date of Patent: Nov. 5, 2002

(54) UNIVERSAL CARRIER TRAY

(75) Inventors: Charles Anderson, Los Altos, CA (US); Quang D. Nguyen, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 105 days.

(21) Appl. No.: 09/651,892

(22) Filed: Aug. 30, 2000

(51) Int. Cl.[7] .............................................. B65D 85/30
(52) U.S. Cl. ...................... 206/725; 206/728
(58) Field of Search ................................ 206/701, 719, 206/722–728, 564; 600/556

(56) References Cited

U.S. PATENT DOCUMENTS

| | | | | |
|---|---|---|---|---|
| 4,620,832 A | * | 11/1986 | Alemanni | 206/728 |
| 5,337,893 A | * | 8/1994 | Nami et al. | 206/722 |
| 5,551,572 A | * | 9/1996 | Nemoto | 206/728 |
| 5,738,108 A | * | 4/1998 | Hein | 600/556 |

* cited by examiner

Primary Examiner—Luan K. Bui

(57) ABSTRACT

A carrier tray is provided for holding a semiconductor device that has a two dimensional array of regularly spaced rows and columns of holes having one and only one pitch and one and only one pocket size. The holes are configured to receive a solder ball from a ball grid array package. The carrier tray can engage at least two differently sized ball grid array packages, thereby avoiding the expense and long lag time associated with designing a new product carrier tray for each new semiconductor device.

13 Claims, 3 Drawing Sheets

UNIVERSAL CARRIER TRAY

TECHNICAL FIELD

The present invention relates to the field of semiconductor manufacture, and more specifically to a universal carrier tray for holding integrated circuit devices.

BACKGROUND ART

The Plastic Ball Grid Array (PBGA) package is a relatively new package design which is gaining popularity as an attractive package solution for memory and microprocessor devices. It offers a high-density package with a smaller form/fit factor than a comparable leadcount quad flat pack package. More importantly, it is designed with solder balls instead of leads, and they are more durable and loosely pitched than the fragile package leads of a comparable surface-mount component. This results in higher board yields.

The PBGA package consists of a thin Printed Circuit Board (PCB) made of a BT epoxy laminate, double-sided, and overlaid with copper over which metallized wire bond pads and a die pad are fabricated. The wirebond pads extend outward to plated through-hole-vias located around the board's periphery. These vias provide the electrical continuity from the top of the board to the other side where copper traces run from the holes to a matrix of solder bumps. The bumps are soldered onto a land pattern on a circuit board in the end-use application. A solder mask is photo defined on the backside of the package to contain the flow of solder during board assembly.

The die is attached to the die pad using a standard epoxy die attach method. Gold ball bonding is used to connect the die pads to the wire bond pads, and the die of overmolded with silicone-modified, epoxy novolac encapsulation material to protect it.

The PBGA package design offers many advantages over other high leadcount packages. Because of the small package size, the BGA offers significant savings in board real estate, occupying about 51% of the space a comparable quad flat pack (QFP) requires. It has a lower profile, too, about one third as thick as a plastic quad flat pack (PQFP) package.

The BGA offers superior electrical performance because the shorter wirebond lengths in it help reduce inductance. Comparing a 169-ball BGA to a 160-ball PQFP, the BGA shows a 31 percent reduction in signal capacitance and a 46 percent reduction in signal time delay.

Studies have been conducted that show the BGA to thermally outshine a comparable PQFP when it is fabricated with "thermal vias" (i.e., through-hole vias) underneath the die pad. These vias allow heat generated by the device to flow to the board, which would improve thermal performance provided the board has a conducting plane built into it. However, thermal data shows that a thermal performance of the BGA (without thermal vias) is not as good as a comparable PQFP. When comparing a BGA with thermal vias to a PQFP with a heat sink attached to the lead frame, the BGA still does not perform as well. To more accurately ascertain the performance of a BGA, the specific end-use application environment needs to be considered.

The pitch of the solder balls on a BGA is far more manageable during board assembly, at 1.0 to 1.5 mm, than the typical of 0.5-mm pitch of high lead count Quad Flat Packs (QFPs).

BGAs can be handled with the same pick-and-place equipment that is used for conventional surface-mount devices, including solder reflow methods. During reflow assembly, the wetting action of the solder balls tends to pull them into alignment so that placement of the component on the solder land does not need to be nearly as precise as with a QFP. The alignment can be off by as much as 6 mils—more forgiving than the 3 mils (0.076 mm) required for fine lead-pitch QFPs.

New BGA packages are constantly being developed having varying body sizes, number of solder balls, and package design including cavity-up or cavity-down configurations, as well as interconnections formed using wirebonding or flip-chip technology. Typically, as each new BGA package is designed, a corresponding tray with holes configured to receive the solder balls on the BGA must be produced. This process is both time-consuming and costly.

There exists a need for an effective product carrier tray for a semiconductor device which eliminates problems associated with the requirement for a new product carrier tray for each new product.

There is also a need for an effective product carrier that eliminates the expense and long lag time associated with designing a new product carrier tray for each new semiconductor device.

SUMMARY OF THE INVENTION

According to one aspect of the invention, a carrier tray is provided for holding a semiconductor device. The carrier tray includes a two dimensional array of regularly spaced rows and columns of holes having one and only one pitch and having one and only one pocket size. The holes are configured to receive a solder ball of a ball grid array package.

Another aspect of the present invention is a method for manufacturing such a semiconductor carrier. The method includes the step of molding plastic into the desired configuration.

A further aspect of the present invention is an assembly that includes a carrier tray for holding a semiconductor device. The carrier tray includes: a two dimensional array of regularly spaced rows and columns of holes having one and only one pitch and one and only one pocket size, and the holes are configured to receive a solder ball of a ball grid array package. The assembly further includes at least two differently sized ball grid array packages comprising solder balls engaged in the holes of the carrier tray.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

Figure 1:
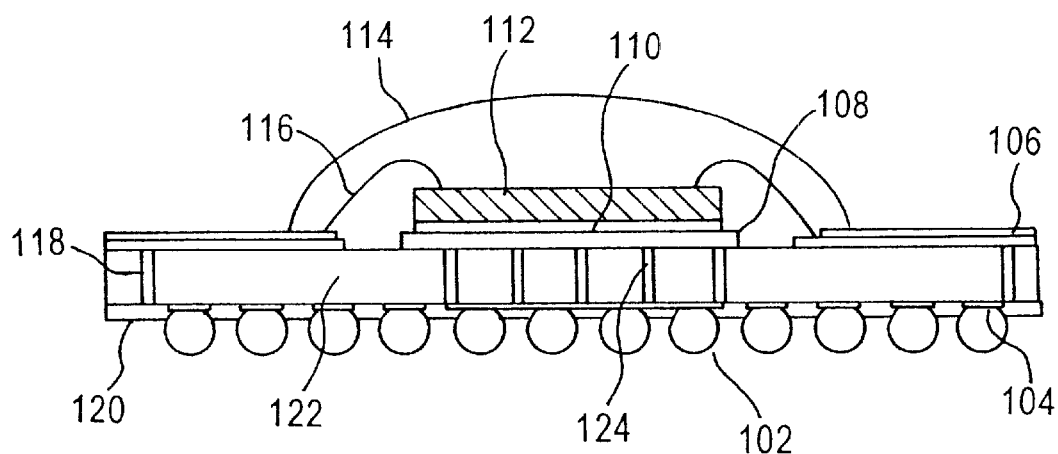
FIG. 1 illustrates a cross-section of a plastic ball grid array package.

FIG. 1 illustrates a cross-section of a plastic ball grid array package 100. The elements of the plastic ball grid array include solder balls 102, copper foil pads and interconnects 104, plated copper conductor 106 and die pad 108. The package further comprises die attach epoxy 110, die 112, epoxy glob top 114, and bonding wire 116. Additional elements of the package include plated through hole 118, solder mask 120, BT epoxy circuit board 122 and thermal ground vias 124.

Figure 2B:
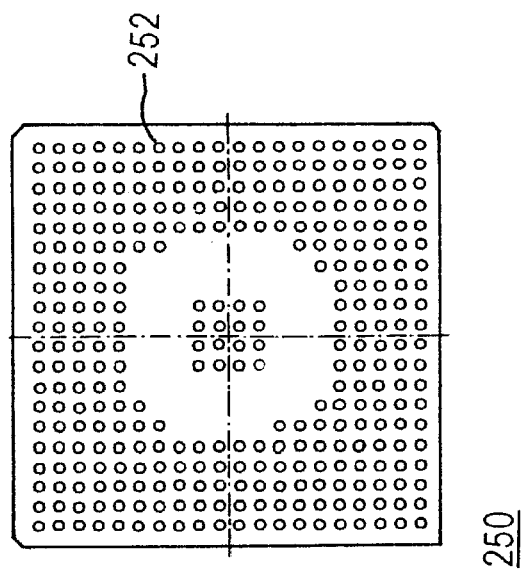
FIGS. 2A–2B illustrate a bottom view of two different BGA packages.
Figure 2A:
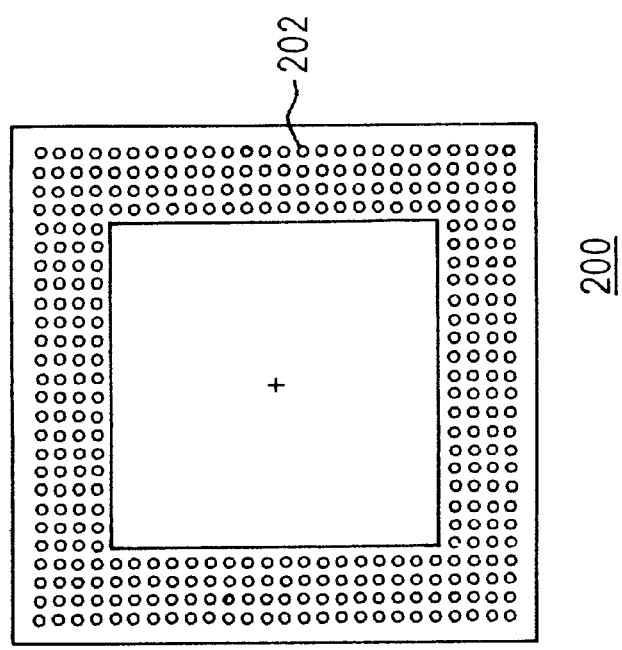

Adverting to FIGS. 2A–2B, FIG. 2A illustrates a bottom view of a BGA package 200. Package 200 includes solder balls 202. FIG. 2B illustrates a bottom view of a BGA package 250 including solder balls 252. It should be appreciated that the overall thickness of each package as well as dimensions including ball height body thickness, seating plane clearance body size, ball footprint, ball matrix size, total ball count, ball pitch and number of rows and columns deep may all differ from one package to another. As a result, each new package requires a new carrier tray configured for the particular package.

Figure 3A:
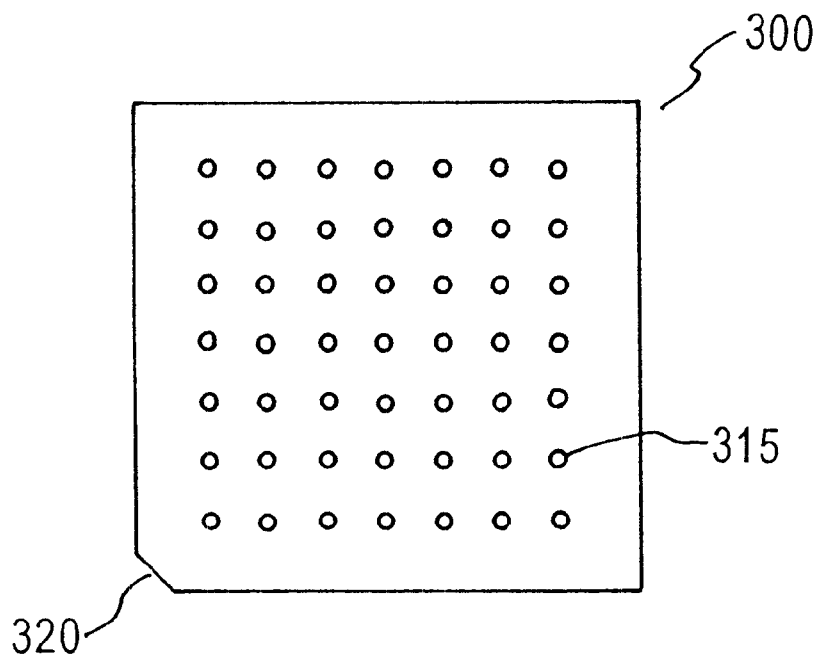
FIGS. 3A–3B illustrate an embodiment of the present invention.
Figure 3B:
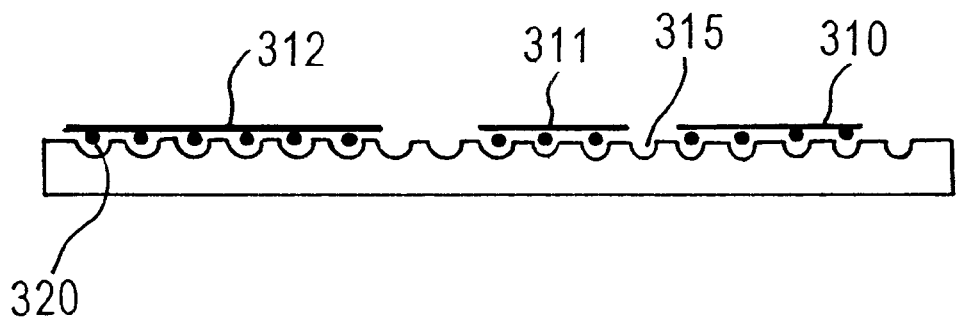

With reference to FIG. 3A, illustrated is a top view of carrier tray 300, for holding a semiconductor device 310. FIG. 3B illustrates a side view of carrier tray 300. Carrier tray 300 includes a two dimensional array of regularly spaced rows and columns of holes 315. The regularly spaced rows and columns of holes have one and only one pitch. Moreover, the two dimensional array of regularly spaced rows and columns of holes have one and only one pocket size. Holes 315 are configured to receive a solder ball of a ball grid array package. In various embodiments, the carrier tray can be configured to hold a cavity-down package or can be configured to hold a cavity-up package. Also, in embodiments of the present invention, the carrier tray includes holes configured to accommodate solder balls having a height from about 0.50 mm to about 0.70 mm.

In embodiments of the present invention, the carrier tray can be configured to accommodate solder balls 320 having a diameter from about 0.60 mm to about 0.90 mm. Also, the holes can be configured to accommodate solder balls having a pitch from about 1.25 mm to about 1.29 mm.

Furthermore, in embodiments of the present invention, the carrier tray can be configured to accommodate one or more packages 310, 311, 312 having a ball count of at least 256. In addition, the carrier tray can be configured to accommodate one or more packages having a ball count from about 256 to about 492. An aspect of the present invention, however, is that the carrier tray can accommodate packages of varying sizes, e.g, 2 or more, such as 4–8, so long as the solder balls have one and only one pitch as well as one and only one pocket size. Ideally, all devices are uniformly oriented so pin one is aligned with the notched corner 320 of the tray 300.

The carrier tray is formed from a material, e.g., plastic. It will be appreciated that other materials suitable for forming relatively thin, sturdy structures can be used to form the tray. Exemplary materials include, for example, conductive thermoplastic, non-conductive and insulated plastic, antistatically coated PVC, antistatically coated polysulfone (to provide protection from ESD damage and to eliminate the potential for low leakage between component leads), conductive carbon-filled polypropylene, and black dissipative BPI-10 plastic. In certain embodiments, the carrier material can withstand temperatures up to about 40° C. to about 60°, for example, temperatures of 125° C. to 150° C. The material can also include a carbon-based material or be antistatically coated to provide ESD protection.

Multiple trays of product can be stacked for shipment with an additional tray serving as a cover. All devices can be uniformly oriented so pin one is aligned with the notched corner 320 of tray 300.

The product carrier of the present invention may comprise one or more materials and/or may comprise one or more layers of material. Further, the inventive product carriers may comprise a recycled material, such as about 5% to 30% recycled materials In the embodiment illustrated in FIG. 3B, the tray is configured to accommodate multiple semiconductor devices. However, the inventive product carrier may be configured to accommodate a single device and/or product carriers may be configured to accommodate a plurality of devices, one or more devices each of which is already being held in an individual carrier as well as different devices with differing configurations.

The inventive product carriers are uniformly sized, in compliance with standard JEDEC outlines. The inventive product carriers are also sized to ensure that there is no excessive movement of product during shipping and handling. This protects the mechanical integrity of the package including the solder balls; it also ensures an unimpaired dispensing of product for manufacturing operations.

For shipment, a stack of trays, for example, six trays, can be secured with straps; five containing parts and the sixth serving as a cover. Bound trays may then be loaded into an antistatic bubble pack bag, for extra cushioning protection, and then packed in a tray box for shipment. Included in the dry pack bag are a prescribed number of humidity indicator cards and desiccant pouches, depending on the quantity of devices in the bag.

The inventive product carrier can be made by molding a material, such as molten plastic, into the desired shape, as with conventional techniques.

Upon determination that a product is moisture sensitive, the product is dry packed for storage and shipment. The first step in the dry pack process is to remove any moisture buildup in the package by baking the finished product for 5 to 15.5 hours, depending on the package type, at 125° C. +/–5° C. While baking, the product is contained in the product carriers (provided the carrier is made of material that can withstand the high temperature) or aluminum trays or tubes. Within 50 hours after baking, the product is sealed in a dry pack bag under a partial vacuum.

An exemplary dry pack bag (i.e., moisture barrier bag) is designed with three layers. The inner layer is a low-density polyethylene, which has a static-dissipative coating. A second layer is 400 angstroms aluminum metallized to 92-guage polyester. The third layer is 400 angstrom aluminum metallized to 92-guage polyester, which has a static-dissipative coating. ESD protection is provided by the inner layer of antistatic polyethylene and the second layer of aluminum metallized polyester.

The bag is sealed using an impulse heat sealer at a seal time of about 1.0 to about 1.5 seconds; and a seal pressure of about 40 to about 50 psi; and a temperature range of about 191 to about 232° C.

Included in each dry pack bag is a card that has humidity sensitive elements which turn from blue to pink whenever the specific RH level is exceeded.

Labels may also be applied to the outside of the dry pack bag. For example, a standard product label, which identifies the contents by manufacturing lot number, product part number, and the product date code(s) and quantity per date code. Also, a dry pack caution label, which identifies the date the bag was sealed, the dry pack expiration date (which is 12 months later)), as well as product handling guidelines. A small moisture-sensitivity caution label may also be applied to the outside of the box in which the dry packed parts are packed.

Described has been a carrier and method for manufacturing an apparatus that is a carrier for semiconductor devices. An advantage of the invention is that it can easily be implemented and is both efficient and cost-effective. Another advantage of the invention is that it is readily fabricated and customized to various semiconductor devices. In this disclosure, there is shown and described only certain preferred embodiments of the invention, but, as aforementioned, it is to be understood that the invention is capable of use in various other combinations and environments and is capable of changes or modifications within the scope of the inventive concept as expressed herein.

What is claimed is:

1. An assembly comprising:
   a carrier tray for holding a semiconductor device, the carrier tray comprising: a two dimensional array of regularly spaced rows and columns of holes having one and only one pitch and one and only one pocket size, said holes being configured to receive a solder ball of a ball grid array package; and
   at least two differently sized ball grid array packages comprising solder balls engaged in the holes of the carrier tray.

2. The assembly of claim 1, wherein the carrier tray is configured to hold a cavity-down package.

3. The assembly of claim 1, wherein the carrier tray is configured to hold a cavity-up package.

4. The assembly of claim 1, wherein the carrier tray comprises holes configured to accommodate balls having a height from about 0.50 mm to about 0.70 mm.

5. The assembly of claim 1, wherein the carrier tray comprises holes configured to accommodate balls having a diameter from about 0.60 mm to about 0.90 mm.

6. The assembly of claim 1, wherein the carrier tray comprises holes configured to accommodate balls having a pitch from about 1.25 mm to about 1.29 mm.

7. The assembly of claim 1, wherein the carrier tray comprises holes configured to accommodate a package having a ball count of at least 256.

8. The assembly of claim 1, wherein the carrier tray comprises holes configured to accommodate a package having a ball count from 256 to 492.

9. The assembly of claim 1, wherein the carrier tray is made of 25% recycled material.

10. The assembly of claim 1, wherein the carrier tray comprises polyvinyl chloride and is either carbon-filled or antistatically coated to provide ESD protection.

11. The assembly of claim 3, wherein the carrier tray material comprises about 5% to about 30% recycled materials.

12. The assembly of claim 3, wherein the carrier tray further comprises a notched edge.

13. The assembly of claim 3, wherein the carrier tray is made by molding.

* * * * *